US007835131B2

(12) United States Patent
Hurly

(10) Patent No.: US 7,835,131 B2
(45) Date of Patent: Nov. 16, 2010

(54) ELECTRIC FENCE ENERGISER OUTPUT ENERGY CONTROL

(76) Inventor: Leslie Sean Hurly, c/o 13 Richard Road, Industria North, Johannesburg (ZA) 1709

( * ) Notice: Subject to any disclaimer, the term of this patent is extended or adjusted under 35 U.S.C. 154(b) by 325 days.

(21) Appl. No.: 11/922,869

(22) PCT Filed: Jul. 21, 2006

(86) PCT No.: PCT/ZA2006/000089

§ 371 (c)(1),
(2), (4) Date: Dec. 26, 2007

(87) PCT Pub. No.: WO2007/012090

PCT Pub. Date: Jan. 25, 2007

(65) Prior Publication Data

US 2009/0034146 A1 Feb. 5, 2009

(30) Foreign Application Priority Data

Jul. 22, 2005 (ZA) ............................... 2005/06380

(51) Int. Cl.
*H03K 3/00* (2006.01)

(52) U.S. Cl. ....................................... 361/232; 307/106

(58) Field of Classification Search ................. 361/232; 307/106

See application file for complete search history.

(56) References Cited

U.S. PATENT DOCUMENTS

| | | | | |
|---|---|---|---|---|
| 4,396,879 | A * | 8/1983 | Weinreich et al. | 361/232 |
| 4,859,868 | A | 8/1989 | McKissack et al. | |
| 6,020,658 | A | 2/2000 | Woodhead et al. | |
| 2002/0079909 | A1 | 6/2002 | Reeves | |
| 2004/0169171 | A1* | 9/2004 | Reeves et al. | 256/10 |

FOREIGN PATENT DOCUMENTS

| | | |
|---|---|---|
| WO | WO 00/35253 | 6/2000 |

OTHER PUBLICATIONS

"Written Opinion of the International Searching Authority", European Patent Office, 7 pages, 2006.
"International Search Report", European Patent Office, 3 pages, Sep. 2006.

* cited by examiner

*Primary Examiner*—Danny Nguyen
(74) *Attorney, Agent, or Firm*—Tutunjian & Bitetto, P.C.

(57) ABSTRACT

An electric fence energizer which includes a pulse generator which produces a bi-polar pulse train and a control circuit which applies a mono-polar pulse, or a bi-polar pulse, derived from the pulse train to the fence in response to a load condition on the fence.

7 Claims, 2 Drawing Sheets

V
t
60
62

V
t
60A
60B
62A
62B 30A
52
46
48
38
70
CONTROL
SENSOR
36
42
72
44
34
42A
44A

ELECTRIC FENCE ENERGISER OUTPUT ENERGY CONTROL

BACKGROUND OF THE INVENTION

This invention relates generally to an electric fence and more particularly to controlling the output energy of one or more energisers which are used to electrify the fence.

Electric fences are in widespread use inter alia for livestock control and for security purposes. It is desirable to have a high level of energy output by an energiser to make a fence excitation voltage less susceptible to electrical load conditions on a fence and, in respect of a long fence, to reduce the number of energisers. However the energy output level prevailing on the fence must be non-lethal and must comply with legislative provisions.

FIG. 1 of the accompanying drawings illustrates a typical prior art arrangement 10 wherein a capacitor 12 of capacitance C is charged by an external charging circuit to a voltage V. A switch 14, in the nature of a thyristor, is used, in a controlled manner, to discharge the capacitor through a primary wounding 16 of a transformer 18. A voltage is then induced in a secondary winding 20 which is applied to a fence.

The energy E stored in the capacitor 12 is given by the expression $E=\frac{1}{2}CV^2$.

It is evident that the output energy can be regulated by controlling the voltage V or the magnitude of the capacitance C. In the latter case a number of capacitors can be used to achieve energy regulation.

Typically energy control is achieved by regulating the voltage V. The fence excitation voltage is measured during a firing pulse and then, according to a control algorithm, the voltage to which the capacitor is charged for a subsequent discharge pulse is determined.

Generally an energiser is characterised and regulated by its performance across a 500 ohms load. Under certain heavy load conditions, for example if a low resistance (less than 500 ohms) prevails between output terminals of an energiser, then the output energy may substantially exceed the level which would arise if the energiser had been loaded with a load of 500 ohms or higher resistance.

A problem with this type of situation is that there is always a minimum delay of one pulse in the adaption of the energiser output energy level applied to the fence. Thus, if a person touches a heavily loaded fence and the load condition then changes to a lighter load, a substantial amount of energy can be injected into the fence before the energy level is dropped, and this may prove to be lethal to such a person.

International application No. PCT/NZ99/00212 addresses the aforementioned problem by controlling the energiser output according to the rate of change of the electrical load, on the fence, detected by a sensor.

The present invention is concerned with an alternative approach to the regulation of the output energy of an energiser.

SUMMARY OF THE INVENTION

The invention provides, in the first instance, a method of controlling the output energy of an electric energiser connected to a fence which includes the steps of monitoring a load condition of the fence and, in response to the monitoring step, of energising the fence with at least one bi-polar pulse if the load condition is acceptable and energising the fence with at least one mono-polar pulse if the load condition is unacceptable.

Each pulse may be derived from a respective bi-polar pulse train. Pulses derived from a plurality of pulse trains can be interwoven in time sequence to provide a further degree of control of the output energy of the energiser.

Each pulse train may be of any suitable waveform. A preferred waveform is sinusoidal. The mono-polar pulses referred to may comprise positive pulses or negative pulses, according to requirement.

The invention provides, in the second instance, a method of controlling the output energy of an electrical energiser connected to a fence which includes the steps of:

(a) energising the fence with a pulse of a first polarity;

(b) monitoring a load condition of the fence;

(c) energising the fence with a pulse of a second polarity which is opposite to the first polarity only if the load condition of the fence is acceptable; and (d) repeating steps (a), (b) and (c) indefinitely.

According to a different aspect of the invention there is provided an electric energiser for a fence which includes a pulse generator which produces a pulse with a first polarity which is used to energise the fence, a sensor for monitoring a load condition of the fence, and a control unit which, in response to the sensor, controls the pulse generator to produce a pulse with a second polarity, opposite to the first polarity, to energise the fence only if the load condition of the fence is acceptable.

Preferably the pulse generator produces a bi-polar pulse train and the pulse with the first polarity and the pulse of the second polarity are derived from the bi-polar pulse train.

Each pulse may have any suitable waveform and preferably the pulse train is sinusoidal with the mono-polar pulses being half sinusoids.

A plurality of pulse generators may be used and interconnected so that pulses from the respective pulse trains output by the pulse generators can be interwoven in time thereby to provide a further degree of control over the energy level applied to the fence.

BRIEF DESCRIPTION OF THE DRAWINGS

The invention is further described by way of examples with reference to the accompanying drawings in which.

DESCRIPTION OF PREFERRED EMBODIMENTS

The use of energisers which produce mono-polar pulses for fence excitation is fairly standard. Such energisers are however not highly efficient in energy usage with an energy conversion factor in excess of 70% being difficult to obtain. This factor is given by the ratio of energiser output energy to stored energy.

The present invention is based on the use of bi-polar and mono-polar pulse trains which can achieve energy conversion factors of the order of 90%.

In broad terms in accordance with the principles of the invention, a fence is energised with pulses selected from a bi-polar pulse train. The fence loading is monitored during the first half of a bi-polar waveform and, if the loading is acceptable, the second half of the waveform, which is a pulse of opposite polarity to the first half, is generated and applied to the fence. However if the load conditions change adversely during the first half of the bi-polar waveform the second half of the waveform is not generated, thereby effectively halving the energy output of the energiser. Provided the energiser design is such that the energy in half of the bi-polar waveform complies with legal requirements then an effective means of energy control is provided without incurring a one pulse delay.

Figure 1:
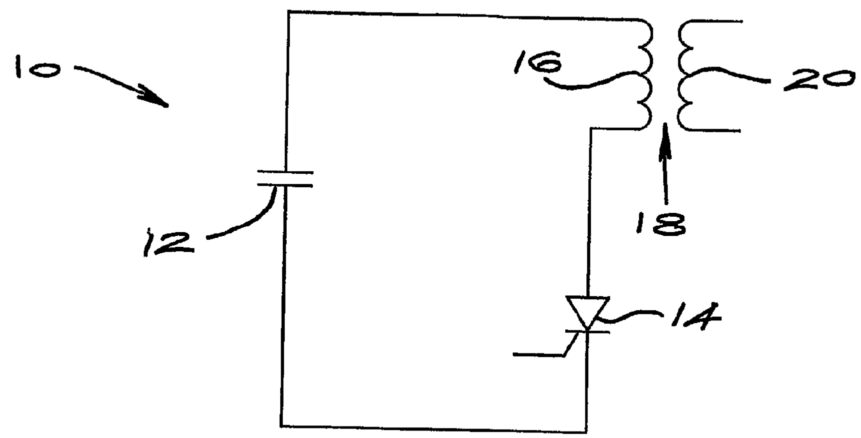
FIG. 1 illustrates a circuit of a conventional energiser and has been described in the preamble hereto.
Figure 2:
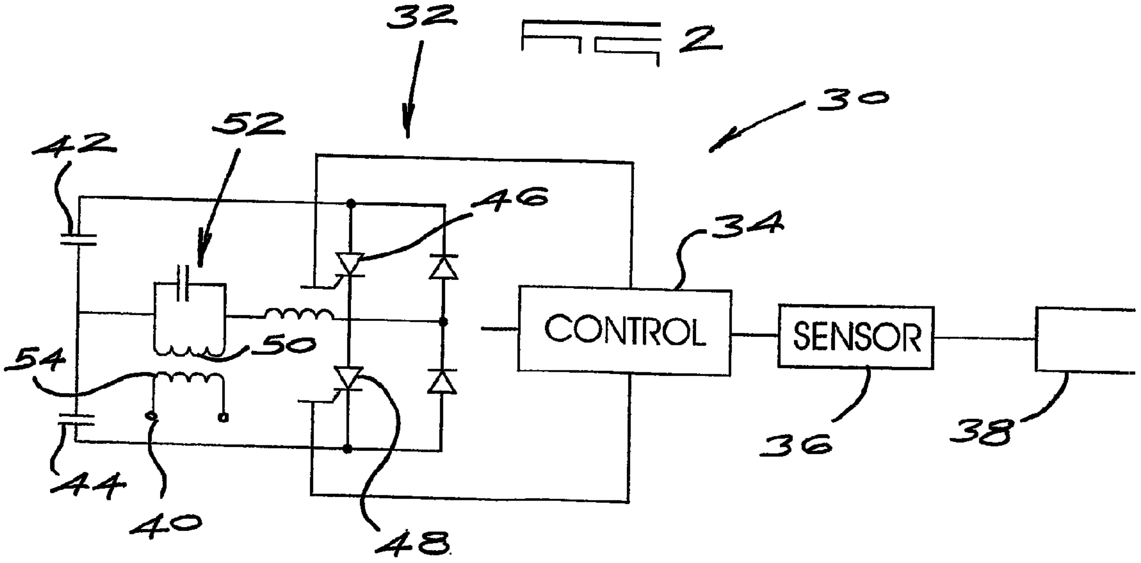
PRIOR ART FIG 2
FIG. 2 is a circuit of an energiser according to the invention.

FIG. 2 illustrates a portion of an energiser 30, according to the invention, which includes a half bridge circuit 32, a control unit 34 and a sensor 36 which is connected to a fence 38 which is also connected to terminals 40 in the half bridge circuit.

The circuit 32 includes two energy storage capacitors 42 and 44 respectively which are charged in a controlled manner using conventional techniques by a suitable charging circuit, not shown. Two thyristors 46 and 48, or other electronic switches, are switched by the control unit 34, as desired, to cause the capacitors to discharge through a primary winding 50 of a pulse transformer 52. The terminals 40 are the output terminals of a secondary winding 54 of the pulse transformer.

Figure 3:
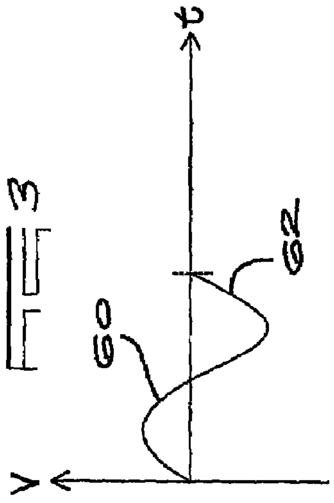
FIG. 3 shows one output waveform of the energiser of FIG. 2.

If the capacitor 42 is discharged by operating the thyristor 46 a pulse 60 of a first polarity, see FIG. 3, is produced while if the thyristor 48 is closed to discharge the capacitor 44, at a carefully controlled time, a pulse 62 of an opposing polarity is produced. Essentially the pulses 60 and 62 constitute a sinusoidal waveform.

The pulses are applied to the fence 38. The sensor 36 monitors the load condition of the fence. This can be done in any appropriate way and, for example, the voltage which prevails on the fence or the current which flows through the fence can be measured, or both techniques can be used. The invention is not limited in this respect.

While the pulse 60 is applied to the fence 38 the load condition of the fence is monitored. If an undesirable load change occurs this is detected by the sensor 36, and the control unit operates to prevent generation of the second pulse 62. The energiser design is such that the maximum energy discharged in a half cycle (i.e. for the pulse 60 or the pulse 62) of the bi-polar wave shown in FIG. 3 complies with legislative requirements and, if the fence is lightly loaded, the energy level prevailing on the fence is within safe limits.

If the fence is heavily loaded then this is detected by the sensor 36. Both halves 60 and 62 of the bi-polar waveform are generated and applied to the fence. This doubles the energiser output energy without the danger of the energiser contravening legislation.

When the pulse 62 is applied to the fence the load condition is again monitored and depending on the load condition the following pulse is either applied to the fence, or not applied. The process continues in this way, indefinitely.

A first benefit is that the one-pulse delay problem referred to is avoided. Secondly the energy conversion efficiency (the ratio of energiser output energy to stored energy) is high, typically in the region of 90%. This exceeds the efficiency which can usually be achieved through the use of a mono-polar pulse train alone.

Figure 4:
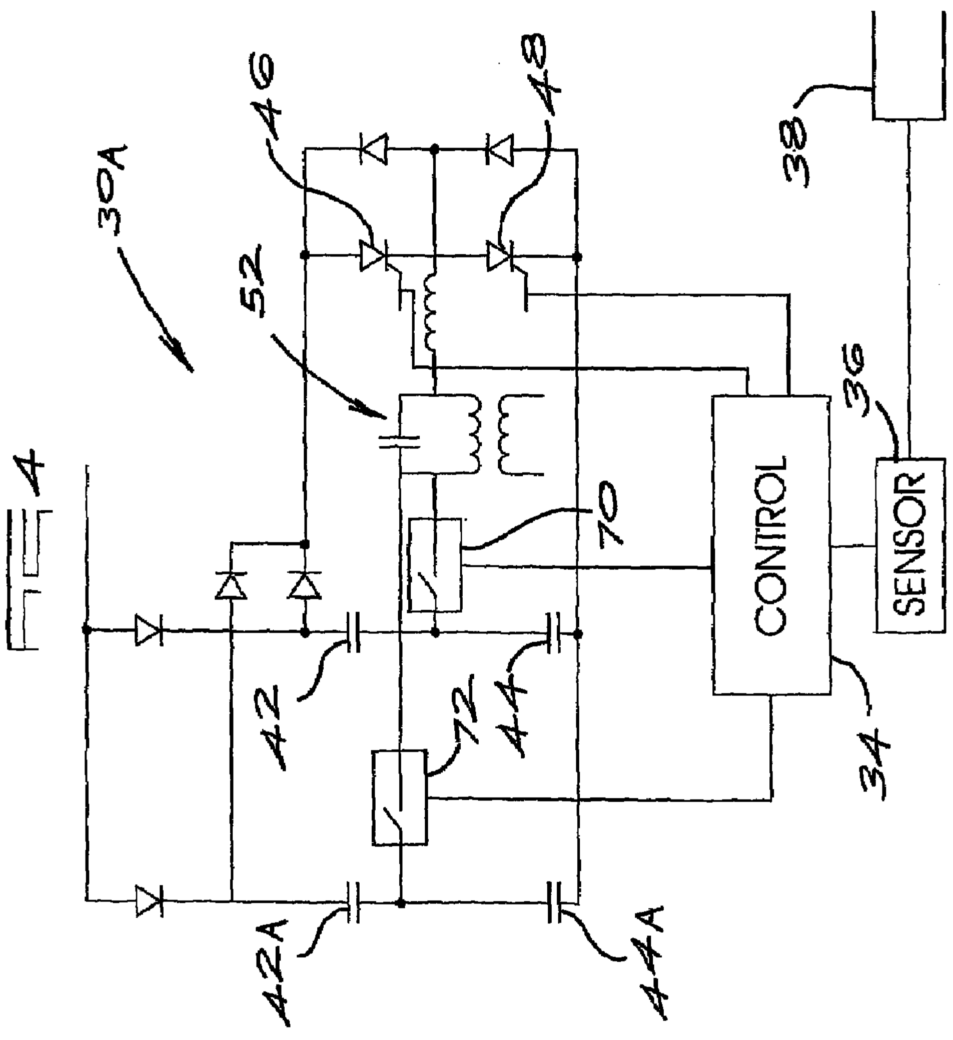
FIG. 4 illustrates an energiser circuit, according to the invention, based on a modification of the FIG. 2 circuit.

A modified circuit 30A shown in FIG. 4 achieves further control over the level of energy applied to the fence.

The circuit 30A has a number of similarities to the circuit 30 and consequently like reference numerals are used to designate like components. Two additional storage capacitors 42A and 44A respectively are included in the circuit 30A. First and second switches designated 70 and 72 respectively are provided between the capacitors 42 and 44 and the pulse transformer on the one hand, and the capacitors 42A and 44A and the pulse transformer on the other hand.

The various capacitors are charged, in a controlled and regulated manner, from an external charging circuit, not shown, using conventional techniques.

If the first switch 70 is closed and the second switch is open then the capacitors 42 and 44 can be discharged in a controlled manner using the thyristors 46 and 48. This is similar to what is done in the circuit of FIG. 2 and, referring to FIG. 5, the discharging of these capacitors results in corresponding half sinusoids 60A and 62A respectively which together make up a full sinusoidal waveform.

Figure 5:
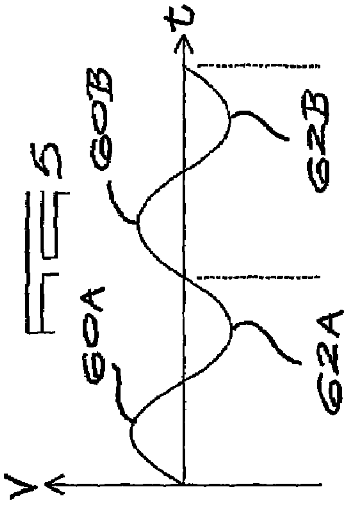
FIG. 5 illustrates an output waveform produced by the circuit of FIG. 4.

If the first switch is opened and the second switch 72 is closed then the capacitors 42A and 44A are discharged resulting in a second full sinusoidal waveform with components 60B and 62B, as shown in FIG. 5. This process can be repeated, as required, to interleave the waveforms 60B and 62B resulting from the capacitors 42A and 44A, with the waveforms 60A and 62A which result from the capacitors 42 and 44.

In respect of each full sinusoid waveform it is possible to generate mono-polar and bi-polar pulses according to the loading on the fence. With the FIG. 2 configuration the energy which is applied to the fence can be switched between a maximum level and a level which is 50% of the maximum level. With the FIG. 4 configuration the energy level can be at a maximum or, depending on the number of half pulses generated per unit time, at 75%, 50% or 25%, of the maximum level.

The invention claimed is:

1. A method of controlling the output energy of an electric energiser connected to a fence, the method comprising the steps of:

generating a plurality of pulse trains;

monitoring a load condition of the fence;

in response to the monitoring step, energising the fence with at least one bi-polar pulse derived from a bi-polar pulse train if the load condition is acceptable; and energising the fence with at least one mono-polar pulse derived from a bi-polar pulse train if the load condition is unacceptable, and interweaving in time sequence selected pulses from the plurality of pulse trains.

2. The method according to claim 1 wherein the bi-polar pulse has a sinusoidal waveform and the mono-polar pulse has a half sinusoidal waveform.

3. A method of controlling the output energy of an electrical energiser connected to a fence comprising the steps of:

(a) generating a bi-polar pulse train;

(b) energising the fence with a pulse of a first polarity derived from the bi-polar pulse train;

(c) monitoring a load condition of the fence;

(d) energising the fence with a pulse of a second polarity which is opposite to the first polarity and which is derived from the bi-polar pulse train only if the load condition of the fence is acceptable; and (e) repeating steps (b), (c) and (d) indefinitely.

4. An electric energiser for a fence comprising:

a pulse generator which produces a pulse with a first polarity which is used to energise the fence, a sensor for monitoring a load condition of the fence, and a control unit which, in response to the sensor, controls the pulse generator to produce a pulse with a second polarity, opposite to the first polarity, to energise the fence only if the load condition of the fence is acceptable.

5. An electric energiser according to claim 4 wherein the pulse generator produces a bi-polar pulse train and the pulse with the first polarity and the pulse of the second polarity are derived from the bi-polar pulse train.

6. An electric energiser according to claim 5 wherein the bi-polar pulse train is sinusoidal.

7. An electric energiser according to claim 4 further comprising a plurality of pulse generators which produce respective pulse trains and the control unit is operable to interweave in time sequence selected pulses from the pulse trains.

* * * * *